United States Patent [19]  [11] 4,012,302
Wang et al.  [45] Mar. 15, 1977

[54] PHOTOCURABLE COMPOSITIONS CONTAINING S-ARYL ARYLCARBOTHIOIC ACID ESTERS AS PHOTOINITIATORS

[75] Inventors: Richard H. S. Wang; James G. Pacifici; Gordon C. Newland, all of Kingsport, Tenn.

[73] Assignee: Eastman Kodak Company, Rochester, N.Y.

[22] Filed: Feb. 17, 1976

[21] Appl. No.: 658,328

[52] U.S. Cl. .......................... 204/159.12; 96/115 P; 204/159.15; 204/159.16; 204/159.18; 204/159.19; 204/159.24; 260/17.4 R; 260/75 UA; 260/77.5 CR; 260/859 R; 260/865; 427/54

[51] Int. Cl.$^2$ ..................... C08L 1/00; C08F 8/18; C08F 2/46

[58] Field of Search ................ 204/159.23, 159.24, 204/159.18, 159.12, 159.16, 159.19; 96/115 P

[56] References Cited

UNITED STATES PATENTS

| | | | |
|---|---|---|---|
| 3,827,957 | 8/1974 | McGinniss | 204/159.23 |
| 3,903,322 | 9/1975 | Rawe et al. | 427/54 |
| 3,962,056 | 6/1976 | Pacifici et al. | 204/159.15 |

*Primary Examiner*—Richard B. Turer
*Attorney, Agent, or Firm*—J. Frederick Thomsen; Daniel B. Reece, III

[57] ABSTRACT

Compositions comprising a photocurable ethylenically unsaturated compound and an S-aryl arylcarbothioic acid ester or a bis-S-aryl aryl-dicarbothioic acid ester.

7 Claims, No Drawings

PHOTOCURABLE COMPOSITIONS CONTAINING S-ARYL ARYLCARBOTHIOIC ACID ESTERS AS PHOTOINITIATORS

This invention relates to photocurable compositions useful as coating and molding compositions and to a process of making photocurable coatings and moldings therefrom. More particularly, the invention relates to photocurable compositions comprising one or more photopolymerizable or photocross-linkable ethylenically unsaturated compounds and a photoinitiating amount of a S-aryl arylcarbothioic acid ester or a bis-S-aryl aryldicarbothioic acid ester.

The photoinitiated or photoinduced curing of a wide variety of ethylenically unsaturated compounds, including polymers, is well known. Such curing is carried out by mixing a relatively minor portion of a photoinitiator with one or more ethylenically unsaturated compounds, forming a film or shaped article of the mixture and effecting curing by exposing the film or shaped article to light. Generally, the light should contain effective amounts of light having wave lengths of 2000 to 4000 Angstrom (A.) units. Typical of the photoinitiators which have been used in the past are benzoins, benzophenones, halogenated hydrocarbons and disulfides.

We have discovered that S-aryl arylcarbothioic acid esters and bis-S-aryl aryldicarbothioic acid esters are effective initiators for the photocuring, including polymerization and cross-linking, of ethylenically unsaturated, photocurable compounds. The aryl moieties of the esters are monocyclic, carbocyclic aryl such as phenyl and phenyl substituted with one or more substituents which are inert, i.e., do not enter into the reaction by which the esters and diesters are produced. Examples of such inert substituents include alkyl, alkoxy, halogen, cyano, dialkylamino, acylamido, aryl, aryloxy, benzoxazolyl, benzothiazolyl, and benzimidazolyl. A preferred class of the esters and diestes have the formula:

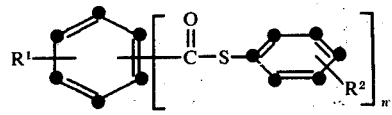

I.

wherein $n$ is 1 or 2 and $R^1$ and $R^2$ are the same or different and are hydrogen, alkyl or up to about 12 carbon atoms, alkoxy of up to about 12 carbon atoms, halogen, phenyl, phenoxy or 2-benzoxazolyl. Especially preferred because of their cost:performance ratio are those esters of formula I in which $R^1$ is hydrogen or lower alkyl containing up to 4 carbon atoms, particularly methyl, $R^2$ is hydrogen, lower alkyl containing up to 4 carbon atoms, particularly methyl or 2-benzoxazolyl, and $n$ is 1.

The esters and diesters of formula I can be prepared according to techniques well-known in the art. One method of synthesis is described in U.S. Pat. No. 3,260,736. Another method that can be used is the reaction of an arylcarboxylic acid chloride or aryl-dicarboxylic acid chloride with an arylthiol. The reactants from which the esters and diesters can be prepared are commercially available and/or can be prepared by conventional procedures.

The ethylenically unsaturated, photocurable compounds useful in carrying out our invention are well-known in the art. See, for example, U.S. Pat. Nos. 3,460,105; 2,769,777; 3,389,904; 3,429,795; 3,450,612 and 3,814,702 and German Offen. No. 1,813,001. The ethylenically unsaturated, photocurable compounds can be monomeric or polymeric compounds or mixtures thereof. The term photocurable is used in its conventional sense to describe polymerization and/or cross-linking caused by exposure to ultraviolet light.

Examples of the more common ethylenically unsaturated, photocurable, monomeric compounds useful in the invention are the derivatives of acrylic and methacrylic acid such as esters, amides and nitriles. Examples of such compounds are methyl methacrylate, ethyl methacrylate, 2-ethylhexyl methacrylate, isobutyl methacrylate, butyl acrylate, 2-ethylhexyl acrylate, 2-hydroxyethyl acrylate, 2-methoxyethyl acrylate, 2-hydroxypropyl acrylate, ethylene glycol di-acrylate, 1,4-tetramethylene bis-methacrylate, trimethylolpropane tri-acrylate, pentaerythritol tetraacrylate, alkyl methacrylate, alkyl acrylate, acrylamide, acrylonitrile, and diacetone acrylamide. The ethylenically unsaturated, photocurable compounds also include acrylate-capped or acrylate-terminated oligomers such as acrylate-capped isocyanates and epoxy resins. Other unsaturated compounds useful in the invention are vinyl acetate, vinyl chloride, vinylidene chloride, styrene, alkylstyrenes, halostyrenes, and divinyl benzenes.

Unsaturated polyesters and cellulose acetate crotonate are examples of polymeric compounds which can make up a part of all of the ethylenically unsaturated photocurable compound of our novel composition. The unsaturated polyesters can be prepared by reaction of $\alpha, \beta$-unsaturated dicarboxylic acids and/or their anhydrides with polyhydric alcohols. A part of the $\alpha,\beta$-unsaturated dicarboxylic acids can be replaced by saturated dicarboxylic acids or aromatic dicarboxylic acids, e.g., isophthalic acid and the like. Polyhydric alcohols are preferably dihydric alcohols such as ethylene glycol, however, trihydric and polyhydric alcohols such as trimethylolpropane can also be conjointly used. Examples of such $\alpha,\beta$-unsaturated dicarboxylic acids or their anhydride counterparts include maleic, fumaric, itaconic and citraconic and the like. As is well-known in the art, unsaturated polyesters usually are used in combination with an ethylenically unsaturated monomer, most commonly styrene, in which they are soluble. Such polyester-monomer solutions generally are called unsaturated polyester resins.

The concentration of the S-aryl arylcarbothioic acid ester or bis-S-aryl aryldicarbothioic acid ester in the novel photocurable composition is dependent upon many variables including the particular ester used, the time of irradiation, the curing rate desired, the ethylenically unsaturated compounds present and the temperature. Thus, the photoinitiating effective amount of such ester can be varied substantially, e.g., from about 0.1 to about 15 weight percent, based on the total weight of the composition, i.e., the weight of the unsaturated compound or compounds present plus the weight of any pigments and other additives that are present. For most uses, such as in coatings including inks where a rapid rate of curing is desired, the composition should contain about 0.5 to about 10 weight percent of the ester.

The photocurable composition of the present invention may contain various additives commonly used in coating and molding compositions. For example, conventional inhibitors, such as hydroquinone, p-methoxyphenol, and t-butyl hydroquinone may be present to alter the curing rate and/or to provide longer storage stability. The composition also can contain pigments or colorants, fillers, antioxidants, plasticizers, flow aids, processing aids and the like.

The photocurable composition described hereinabove is particularly useful in formulating coating compositions, especially inks which can be used to prepare various types of printed materials which, upon exposure to ultraviolet light, cure or dry rapidly.

Our invention is further illustrated by the following examples.

EXAMPLES 1–3

A mixture of isophthaloyl chloride (4.06 g., 0.02 moles) and p-toluenethiol (5.50 g., 0.044 moles) in 75 ml. of pyridine was refluxed for 3 hr. After cooling, the mixture was poured into HCl-ice water. The product, bis[S-4-methylphenyl] thioisophthalate, was filtered and washed with water (m.p. 104°–6° C., quantitative yield).

Using a similar procedure, the following compounds were also prepared:
S-(4-methylphenyl) thiobenzoate, m.p. 68°–70° C. (quantitative yield); S-(4-methylphenyl)-4-(2-benzoxazolyl) thiobenzoate, m.p. 167°–9° C. (yield 90%).

EXAMPLES 4–7

To an 80:20 mixture of a low molecular weight polyester of maleic anhydride and propylene glycol (Hetron 520) and styrene was added at 2% (w/w) concentration the compound to be evaluated as photoinitiator. A 0.004-in. thick coating of the poly-monomer-initiator mixture was applied to a glass plate and cured with a Gates 420U11B mercury lamp (80 watts/in.) for 1 and 2 min. After curing, the films were peeled from the plate and extracted with dichloromethane for 2 hr. Under these conditions the polymer-monomer mixture without initiator will polymerize slowly. Extraction of the unpolymerized portion is a measure of the degree of cure. The results of the tests of the photoinitiators are summarized in Table 1 as ratios of extractable material. The ratio of extractable material is defined as the ratio of percent extractable material in the film cured with photoinitiator to that of the film cured without photoinitiator. By this definition a low ratio is indicative of an efficient photoinitiator.

EXAMPLES 8–10

A photopolymerizable polymer composition composed of 15% cellulose propionate crotonate in 2-hydroxyethyl acrylate was used as base material. To this base material was added at 2% (w/w) the photoinitiator to be tested. The mixtures were coated onto a glass plate and cured for 1 min. with a Gates 420U11B (80 watts/in.) lamp. After curing, the films were peeled from the glass plates and extracted for 2 hr. with dichloromethane. The results of the tests are shown in Table 2.

EXAMPLES 11–13

A base photopolymerizable material consisting of 50 parts urethane-acrylic oligomer (Chempol 19–4827; Freeman Chem. Corp.), 40 parts 2-methoxyethyl acrylate and 10 parts neopentyl glycol diacrylate was prepared as a dope. To equal portions of the base material was added at 2% concentration the photoinitiator to be evaluated. Glass plates were coated with each composition and cured with a Gates 420U11B lamp for 1 min. The polymerized films were stripped from the plates and extracted with dichloromethane for 2 hr. to determine the percent of unpolymerized material. The results of the tests, shown in Table 2, indicate that the thioesters are effective photoinitiators for urethaneacrylic systems.

EXAMPLES 14–16

The photoinitiators were tested at 2% concentration in a composition consisting of: 70 parts 2-methoxyethyl acrylate, 10 parts cellulose propionate crotonate, 10 parts neopentyl glycol diacrylate and 42.5 parts $TiO_2$ (Ti-Pure R-100). Thin films of the liquid compositions were squeezed between two Corex glass plates and cured for 0.5 min. on each side. The cured film was stripped from the plates and extracted with dichloromethane for 2 hr. The photoinitiators tested and the percent extractable material remaining after curing are shown in Table 3.

Table 1

| Example No. | Photoinitiator | Ratio of Extractable Material | |
|---|---|---|---|
| | | Cured 1 min. | Cured 2 min. |
| Control | None | 1.0 | 1.0 |
| 4 | S-(4-methylphenyl) thiobenzoate | .31 | .21 |
| 5 | S-(4-methylphenyl)-4-(2-benzoxazolyl) thiobenzoate | .52 | .42 |
| 6 | S-phenyl-4-(2-benzoxazolyl) thiobenzoate | .46 | .41 |
| 7 | bis[S-4-methylphenyl] thioisophthalate | .32 | .24 |

Table 2

| Example No. | Photoinitiator | % Dichloromethane Extractable |
|---|---|---|
| Control | None | 100 |
| 8 | S-(4-methylphenyl) thiobenzoate | 11.3 |
| 9 | S-(4-methylphenyl)-4-(s-benzoxazolyl) thiobenzoate | 10.6 |
| 10 | bis(S-4-methylphenyl) thioisophthalate | 17.2 |
| Control | None | 100 |
| 11 | S-(4-methylphenyl) thiobenzoate | 15.8 |
| 12 | S-(4-methylphenyl)-4-(2-benzoxazolyl) thiobenzoate | 14.9 |
| 13 | bis(S-4-methylphenyl) thioisophthalate | 22.9 |

Table 3

| Example No. | Photoinitiator | % Dichloromethane Extractable |
|---|---|---|
| Control | None | 100 |
| 14 | S-(4-methylphenyl) thiobenzoate | 8.8 |
| 16 | S-(4-methylphenyl)-4-(2-benzoxazolyl) thiobenzoate | 9.7 |
| 17 | bis(S-4-methylphenyl) thioisophthalate | 9.2 |

The invention has been described in detail with particular reference to certain preferred embodiments thereof, but it will be understood that variations and modifications can be effected within the spirit and scopeof the invention.

We claim:

1. A composition comprising a photocurable ethylenically unsaturated compound and an S-aryl arylcarbothioic acid ester or a bis-S-aryl aryldicarbothioic acid ester photoinitiating effective amount of a compound having the formula:

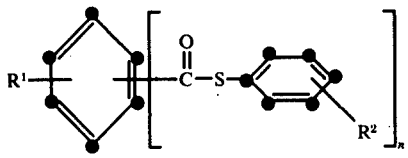

wherein $n$ is 1 or 2 and $R^1$ and $R^2$ are the same or different and are hydrogen, alkyl of up to about 12 carbon atoms, alkoxy of up to about 12 carbon atoms, halogen, phenyl, phenoxy or 2-benzoxazolyl.

2. A composition according to claim 1 wherein $n$ is 1, $R^1$ is hydrogen or lower alkyl containing up to about 4 carbon atoms, and $R^2$ is hydrogen, lower alkyl containing up to about 4 carbon atoms or 2-benzoxazolyl.

3. A composition according to claim 1 wherein the photocurable ethylenically unsaturated compound is a derivative of acrylic acid or an unsaturated polyester resin.

4. A composition according to claim 1 wherein the ester is present in a concentration of about 0.1 to 15 weight percent based on the total weight of the composition.

5. A composition according to claim 1 wherein the photoinitiating effective amount is a concentration of about 0.5 to 10 weight percent based on the total weight of the composition.

6. A composition comprising a photocurable ethylenically unsaturated compound and about 0.5 to 10 weight percent based on the weight of the photocurable ethylenically unsaturated compound, of a compound having the formula

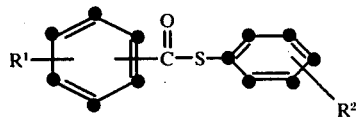

wherein $R^1$ and $R^2$ each is hydrogen or methyl.

7. A composition according to claim 6 wherein the photocurable ethylenically unsaturated compound is an ester of acrylic acid or an unsaturated polyester resin.

* * * * *